(12) United States Patent
Aksin

(10) Patent No.: US 11,863,138 B2
(45) Date of Patent: *Jan. 2, 2024

(54) TRANSCONDUCTANCE CIRCUITS WITH DEGENERATION TRANSISTORS

(71) Applicant: Analog Devices, Inc., Wilmington, MA (US)

(72) Inventor: Devrim Aksin, Stokesdale, NC (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/959,481

(22) Filed: Oct. 4, 2022

(65) Prior Publication Data

US 2023/0023984 A1 Jan. 26, 2023

Related U.S. Application Data

(63) Continuation of application No. 17/026,257, filed on Sep. 20, 2020, now Pat. No. 11,496,103.

(51) Int. Cl.
*H03F 3/45* (2006.01)

(52) U.S. Cl.
CPC ..... *H03F 3/45179* (2013.01); *H03F 3/45183* (2013.01); *H03F 3/45197* (2013.01)

(58) Field of Classification Search
CPC ............. H03F 3/45179; H03F 3/45183; H03F 3/45197; H03F 2203/45388; H03F 2203/45492
USPC ........................................................ 330/252
See application file for complete search history.

(56) References Cited

U.S. PATENT DOCUMENTS

| 3,725,801 A | 4/1973 | Beelitz |
| 5,274,275 A | 12/1993 | Colles |
| 5,570,049 A | 10/1996 | Chen |
| 5,828,265 A | 10/1998 | Mensink et al. |

(Continued)

OTHER PUBLICATIONS

"U.S. Appl. No. 17/026,257, Non Final Office Action dated Mar. 7, 2022", 16 pgs.

(Continued)

*Primary Examiner* — Andrea Lindgren Baltzell
*Assistant Examiner* — Khiem D Nguyen
(74) *Attorney, Agent, or Firm* — Schwegman Lundberg & Woessner, P.A.

(57) ABSTRACT

An example transconductance circuit includes a first portion that includes a first degeneration transistor, configured to receive a first input voltage, and a second portion that includes a second degeneration transistor, coupled to the first degeneration transistor and configured to receive a second input voltage. The first portion further includes a first input transistor, coupled to the first degeneration transistor and configured to provide a first output current, while the second portion further includes a second input transistor, coupled to the second degeneration transistor and configured to provide a second output current. Such a transconductance circuit may be used as an input stage capable of reliably operating within drain-source breakdown voltage of the transistors employed therein even in absence of any other protection devices, and may be significantly faster, consume lower power, and occupy smaller die area compared to conventional transconductance circuits.

20 Claims, 3 Drawing Sheets

(56) References Cited

U.S. PATENT DOCUMENTS

| | | |
|---|---|---|
| 6,583,652 B1 | 6/2003 | Klein et al. |
| 6,867,650 B2 | 3/2005 | Kimura |
| 7,710,197 B2 | 5/2010 | Aoki et al. |
| 9,837,973 B2 | 12/2017 | Brantley et al. |
| 11,496,103 B2* | 11/2022 | Aksin ............... H03F 3/45197 |
| 2009/0219092 A1 | 9/2009 | Kim et al. |
| 2022/0094315 A1 | 3/2022 | Aksin |

OTHER PUBLICATIONS

"U.S. Appl. No. 17/026,257, Notice of Allowance dated Aug. 31, 2022", 10 pgs.

"U.S. Appl. No. 17/026,257, Response filed Jun. 2, 2022 to Non Final Office Action dated Mar. 7, 2022", 11 pgs.

"U.S. Appl. No. 17/026,257, Supplemental Amendment filed Aug. 3, 2022", 12 pgs.

"U.S. Appl. No. 17/026,257, Supplemental Amendment filed Aug. 23, 2022", 12 pgs.

Cortes, et al., "Analysis and Design of Amplifiers and Comparators in CMOS 0.35 µm Technology", Microelectronics Reliability 44, (2004), 8 pgs.

Gupta, "Low Power CMOS Transconductance Multiplier, Dissertation, National Institute of Technology", (Aug. 23, 2010), 51 pgs.

Kuo, et al., "A Linear MOS Transconductor Using Source Degeneration and Adaptive Biasing", IEEE 7 Transactions on Circuits and Systems—II: Analog and Digital Signal Processing, vol. 48, No. 10, (Oct. 2001), 7 pgs.

Sheikholeslami, "Source Degeneration, Circuit Intuitions", IEEE Solid-State Circuits Magazine, (2014), 2 pgs.

\* cited by examiner

US 11,863,138 B2

TRANSCONDUCTANCE CIRCUITS WITH DEGENERATION TRANSISTORS

CROSS-REFERENCE TO RELATED APPLICATIONS

This Application is a continuation (and claims benefit of priority under 35 U.S.C. § 120) of U.S. application Ser. No. 17/026,257 filed Sep. 20, 2020, entitled "TRANSCONDUCTANCE CIRCUITS WITH DEGENERATION TRANSISTORS," the disclosure of which is considered part of (and is incorporated by reference in) the disclosure of this application.

TECHNICAL FIELD OF THE DISCLOSURE

The present disclosure relates generally to electronics and, more specifically, to transconductance circuits.

BACKGROUND

A transconductance circuit (also commonly referred to as a "transconductor" or a "voltage-to-current converter") is a circuit that generates an output current corresponding, or proportional to, an input voltage. For this reason, such circuits are also referred to as voltage-to-current converters. Transconductance circuits may be used in many modern electronic systems utilized within wide range of markets, such as industrial, military, automotive, and automatic testing (e.g., pin electronics). In particular, one or more transconductance circuits may be used in, or associated with, an amplifier or a comparator.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
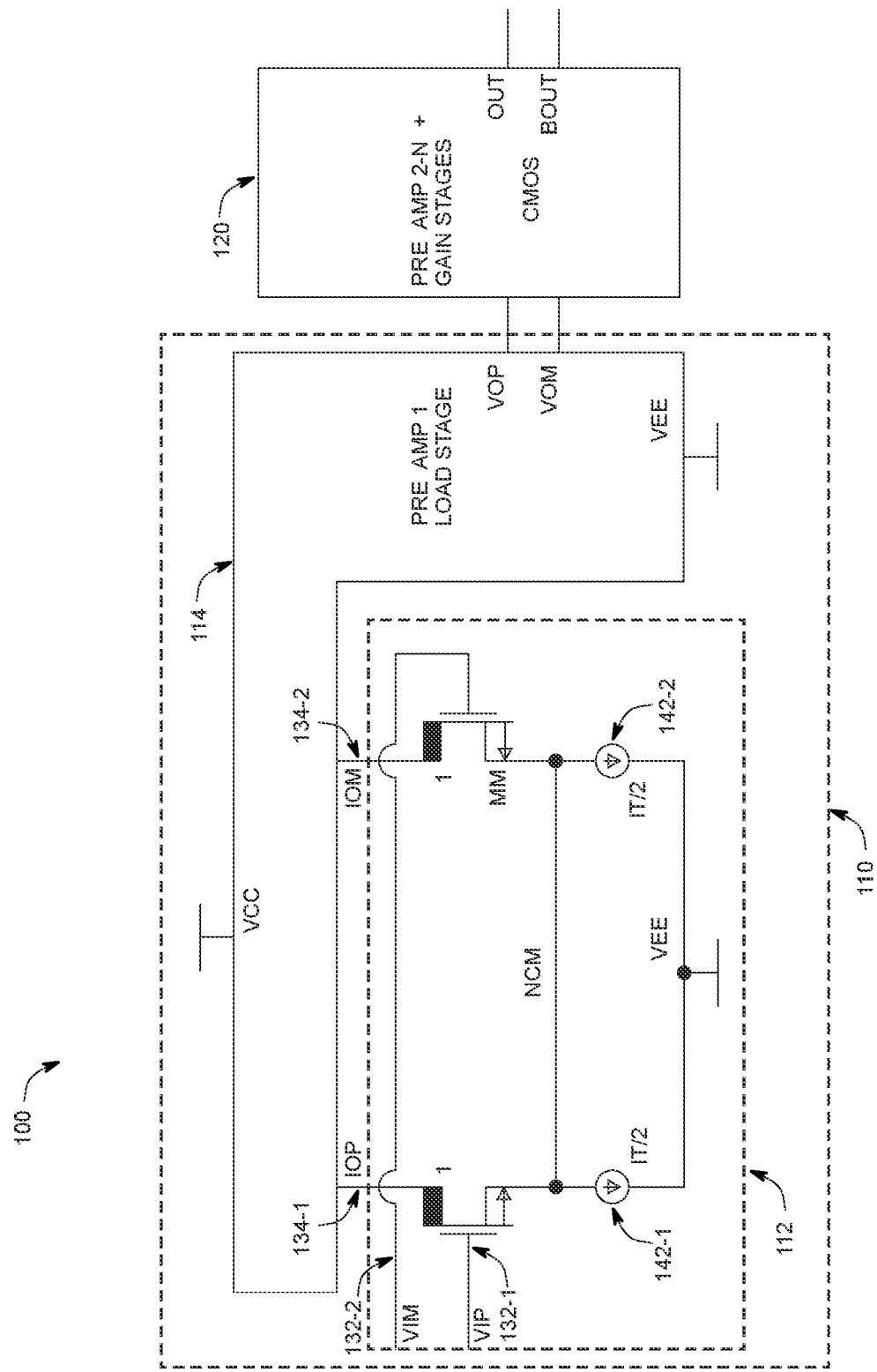
FIG. 1 is an electric circuit diagram of a transconductance circuit with a simple differential pair included in an amplification stage of a device.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

Embodiments of the present disclosure provide transconductance circuits with degeneration transistors. In some implementations, a transconductance circuit with degeneration transistors may be used as a transconductance input stage of an amplification stage, where the transconductance input stage is configured to convert an input voltage signal to an output current signal. In some implementations, the amplification stage may further include a load stage, configured to convert the input stage output current back to an output voltage. One or more of such amplification stages may be included in a device such as an amplifier or a comparator.

The exact design of transconductance circuits with degeneration transistors, described herein, may be realized in many different ways, all of which being within the scope of the present disclosure. In one example of design variations according to various embodiments of the present disclosure, a choice can be made to employ N-type or P-type field-effect transistors (FETs), e.g., to employ N-type metal-oxide-semiconductor (NMOS) or P-type metal-oxide-semiconductor (PMOS) transistors, as transistors of a given transconductance circuit with degeneration transistors. In another example, in various embodiments, a choice can be made as to what type of transistor architecture to employ. For example, any of the transistors of the transconductance circuits with degeneration transistors as described herein may be planar transistors or may be non-planar transistors (some examples of the latter including FinFETs, nanowire transistors or nanoribbon transistors).

One aspect of the present disclosure provides a transconductance circuit that includes a first portion and a second portion. The first portion includes a first degeneration transistor (e.g., transistor MDP, shown in FIG. 3), coupled to a first input and configured to receive a first input voltage (e.g., voltage $V_{IP}$, shown in FIG. 3) at the first input. The first portion further includes a first input transistor (e.g., transistor MP, shown in FIG. 3), coupled to the first degeneration transistor and to a first output, and configured to provide a first output current (e.g., current IOP, shown in FIG. 3) at the first output. The second portion includes a second degeneration transistor (e.g., transistor MDM, shown in FIG. 3), coupled to the first degeneration transistor and to a second input, and configured to receive a second input voltage (e.g., voltage $V_{IM}$, shown in FIG. 3) at the second input. The second portion further includes a second input transistor (e.g., transistor MM, shown in FIG. 3), coupled to the second degeneration transistor and to a second output, and configured to provide a second output current (e.g., current IOM, shown in FIG. 3) at the second output. Such a transconductance circuit may be used as an input stage capable of reliably operating within drain-source (DS) breakdown voltage (BV) (BVDS) of the transistors employed therein even in absence of any other protection devices, and may be significantly faster, consume lower power, and occupy smaller die area compared to conventional transconductance circuits.

The reason why transistors MDP and MDM are referred to as "degeneration transistors" may be explained as follows. These transistors function as nonlinear resistors, meaning that each of transistors MDP and MDM operates as a resistor between their drain and source terminals, where the value of the drain-source resistance is based on the voltage difference between the first and second input voltages. In some embodiments, the variation of the drain-source resistance may be a nonlinear function of the voltage difference between the first and second voltage inputs. Since transistors MDP and MDM operate like resistors, they are basically degenerating the input differential pair formed by the first and second input transistors, MP and MM. Consequently, transistors MDP and MDM are referred to as "degeneration transistors."

Other aspects of the present disclosure provide devices (e.g., amplifiers, comparators, etc.) and systems (e.g., electronic testing systems, etc.) that may include one or more transconductance circuits with degeneration transistors as described herein. While some embodiments of the present disclosure refer to amplifiers and comparators as example devices, and further refer to electronic testing systems as example systems in which transconductance circuits with degeneration transistors as described herein may be implemented, in other embodiments, transconductance circuits with degeneration transistors as described herein may be implemented in devices other than amplifiers or comparators, and/or in systems other than electronic testing systems, all of which embodiments being within the scope of the present disclosure.

As will be appreciated by one skilled in the art, aspects of the present disclosure, in particular aspects of transconductance circuits with degeneration transistors as proposed herein, may be embodied in various manners—e.g. as a method, a device, or a system. Accordingly, aspects of the present disclosure may take the form of an entirely hardware embodiment, at least partially software embodiment (including firmware, resident software, micro-code, etc.) or an embodiment combining software and hardware aspects that may all generally be referred to herein as a "circuit," "module" or "system."

The following detailed description presents various descriptions of specific certain embodiments. However, the innovations described herein can be embodied in a multitude of different ways, for example, as defined and covered by the select examples. In the following description, reference is made to the drawings, where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Sometimes, in the present descriptions, the term "circuit" may be omitted (e.g., a current mirror circuit may be referred to simply as a "current mirror," etc.). If used, the terms "substantially," "approximately," "about," etc., may be used to generally refer to being within +/−20% of a target value, e.g., within +/−10% of a target value, based on the context of a particular value as described herein or as known in the art.

Example Applications of and Requirements for Transconductance Circuits

For purposes of illustrating transconductance circuits with degeneration transistors, proposed herein, it might be useful to first understand phenomena that may come into play when transconductance circuits are involved. The following foundational information may be viewed as a basis from which the present disclosure may be properly explained. Such information is offered for purposes of explanation only and, accordingly, should not be construed in any way to limit the broad scope of the present disclosure and its potential applications.

High-voltage electronic components such as amplifiers or comparators can be found in many modern electronic systems utilized within wide range of markets, such as industrial, military, automotive, and automatic testing (e.g., pin electronics). These components are required to operate within a wide input/output voltage range, generally well beyond the breakdown voltage levels of the transistors used therein, with ever-increasing operating frequencies for variety of reasons, such as increased test throughput or testing high-speed, high-voltage flash-memories.

The high-voltage amplifier/comparator performance requirements for the state-of-the-art electronic testing systems are particularly stringent since the testing systems are expected to perform significantly better than the devices that they are testing. Therefore, these components are expected to operate seamlessly within wide input/output voltage range, at high speed (or equivalently with minimum delay variation for comparators) to support higher and higher data rates. In addition, these components are expected to operate with low power consumption per unit to allow massive parallelism as high pin count/high volume device testing demands. Hence, high voltage range, high operating frequency and low power consumption are three key design parameters differentiating the offered product to the respective market.

Generally speaking, high-voltage amplifiers/comparators include one or more cascaded preamplifier stages having rather low small signal gain followed by series of cascaded amplification stages to get the desired output signal format. The first preamplifier stage typically includes a transconductance circuit, configured to convert a differential input signal $\Delta VI$ (where "V" stands for "voltage" and "I" stands for "input") to an output current $\Delta IO$ (where "I" stands for "current" and "O" stands for "output"), and a load circuit, configured to convert the input stage output current $\Delta IO$ back to an output voltage $\Delta VO$ (where "V" stands for "voltage" and "O" stands for "output"). The first transconductance stage is a critical sub-component because it sets the performance boundaries of amplifiers/comparators in terms of reliability, input signal range and maximum input data rate. It would be desirable to have a transconductance circuit that 1) has a very large transconductance (gm) at small $\Delta VI$ levels so that the amplifier/comparator in which such a transconductance circuit is included can resolve small $\Delta VI$ levels at full speed, 2) has a very small gm for large $\Delta VI$ levels to minimize delay variation due to the cascading stage over driving, 3) has a wide input signal range, 4) can handle high-voltage levels reliably, and 5) has low power consumption.

For the remainder of the disclosure, the proposed transconductance circuits implementing a self-protected input stage will be analyzed as a part of a high-voltage comparator. That said, the descriptions provided herein, including the advantages of the proposed design, are also applicable for high-voltage amplifiers since both high-voltage comparators and high-voltage amplifiers might have high-voltage levels at their inputs. Furthermore, the transconductance circuits presented here can also be utilized for low-voltage comparator/amplifier designs since they may improve the input stage speed in a very simple and elegant way.

Various transconductance circuits illustrated in the drawings of the present disclosure are shown with N-type input transistors because such transistors may offer operation speed advantage over P-type transistors. Nevertheless, if desired, converting N-type input transistor-based schematics to P-type transistor-based schematics is straight forward for a person skilled in the art and, therefore, such modified embodiments are within the scope of the present disclosure.

Furthermore, transistors of various transconductance circuits illustrated in the drawings of the present disclosure are shown with electric circuit diagram notations of high-voltage MOSFET devices, to indicate that any of these transistors can be a high-voltage transistor such as a an extended drain metal-oxide-semiconductor (EDMOS) transistor, a double-diffused metal-oxide-semiconductor (DMOS) transistor, a laterally-diffused metal-oxide-semiconductor (LDMOS) transistor, or a V-groove metal-oxide-semiconductor (VMOS) transistor. The common property of these high-voltage MOSFET devices is that all of their breakdown voltages may match the process CMOS core breakdown voltages except the drain terminal related breakdown voltages. Using special gate dielectric oxides and drain diffusion engineering, drain terminal breakdown voltages (or blocking voltage) can be increased well beyond the CMOS core breakdown voltage levels. However, in other embodiments, transistors that are not high-voltage transistors may be used as well and, therefore, are within the scope of the present disclosure.

Conventional Transconductance Circuits

Figure 2:
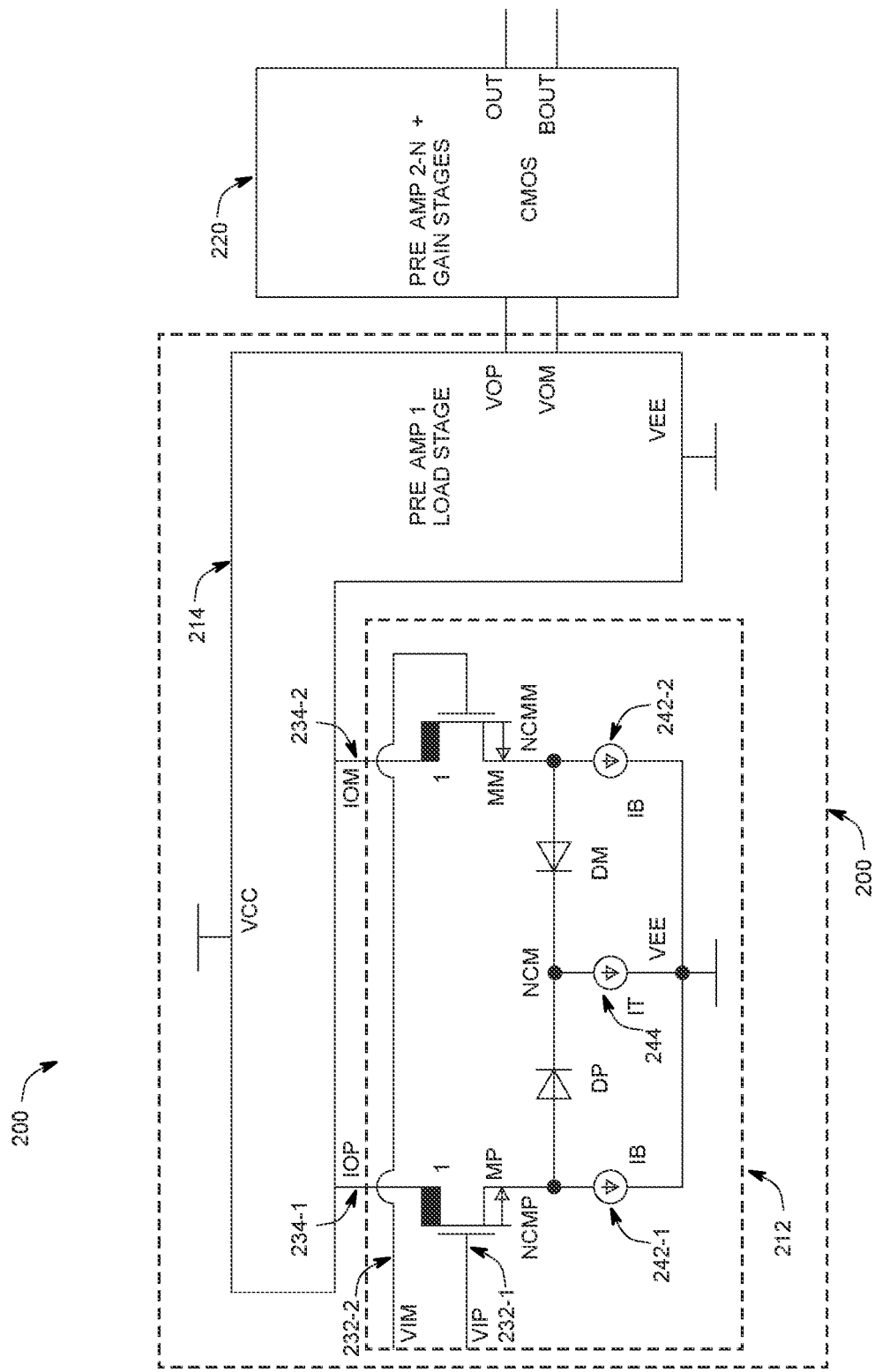
FIG. 2 is an electric circuit diagram of a transconductance circuit with isolation diodes included in an amplification stage of a device.

FIGS. 1 and 2 illustrate some examples of devices with conventional transconductance circuits.

FIG. 1 is an electric circuit diagram of a transconductance circuit 112 with a simple differential pair included in an amplification stage 110 of a device 100. As shown in FIG. 1, the amplification stage 110 may further include a load circuit 114. The device 100 may be a comparator or an amplifier, where the amplification stage 110 may be a first preamplifier stage and may be followed up by one or more gain stages 120.

The implementation shown in FIG. 1 utilizes a classical differential pair of input transistors MP and MM, each of which may be a high-voltage transistor (e.g., an LDMOS transistor). The reliable common-mode voltage range of the classical input differential pair is equal to the LDMOS BVDS, e.g., 24 volts (V). The reliable differential input voltage range, on the other hand, may be approximately equal to gate to source breakdown voltage plus a gate-to-source voltage (VGS), e.g. ≈7-7.5V.

As shown in FIG. 1, in the transconductance circuit 112, one terminal of the first input transistor MP (e.g., the gate terminal of the transistor MP) may be coupled to a first input 132-1, where the transistor MP may receive a first input voltage VIP, while one terminal of the second input transistor MM (e.g., the gate terminal of the transistor MM) may be coupled to a second input 132-2, where the transistor MM may receive a second input voltage VIM. As also shown in FIG. 1, another terminal of the first input transistor MP (e.g., the drain terminal of the transistor MP) may be coupled to a first output 134-1, where the transistor MP may provide a first output current IOP, while another terminal of the second input transistor MM (e.g., the drain terminal of the transistor MM) may be coupled to a second output 134-2, where the transistor MM may provide a second output current IOM. A third terminal of the first input transistor MP (e.g., the source terminal of the transistor MP) may be coupled to a third terminal of the second input transistor MM (e.g., the source terminal of the transistor MM), e.g., via a node NCM. As shown in FIG. 1, for each of transistors MP and MM, the source terminal of the transistor is coupled to the bulk terminal of the transistor.

As also shown in FIG. 1, the transconductance circuit 112 may further include a first current source 142-1, coupled to the source terminal of the first input transistor MP, and a second current source 142-2, coupled to the source terminal of the second input transistor MM. Together, the first and second current sources 142-1/2 may provide a total tail current IT for the differential pair of the input transistors MP and MM of the transconductance circuit 112, e.g., each current source 142 providing a tail current IT/2.

In some embodiments, the transconductance circuit 112 may be included in a comparator (e.g., the device 100 may be a comparator). In this case, VIP and VIM may be the inputs to the comparator. These inputs are provided (driven) by the outside world. The transconductance circuit 112 is then configured to evaluate the difference between the voltage levels of the inputs VIP and VIM and generate an output current indicative of whether the difference is positive or negative (e.g., to generate a logic 1 or logic 0 output indicative of whether the difference between the voltage levels of the inputs VIP and VIM is positive or negative). For example, in some implementations, IOP-IOM may be positive to indicate that VIP−VIM is positive, and IOP-IOM may be negative to indicate that VIP−VIM is negative. The actual value of the difference between IOP and IOM may be a function of the difference between VIP and VIM.

In other embodiments, the transconductance circuit 112 may be included in an amplifier (e.g., the device 100 may be an amplifier). Such an amplifier may be utilized within a feedback and be configured to make the inputs VIP and VIM to be substantially equal by changing the outputs IOP and IOM, which outputs may then be coupled to the amplifier input through the feedback.

The problem with the transconductance circuit 112 may arise due to the fact that the NCM node voltage is set by the one of the input transistors MP, MM that has the largest input voltage at its gate. Once the differential pair of the input transistors MP, MM completely switches the tail current IT to an output, the turned-off input transistor (i.e., the one of the input transistors MP, MM that has the lowest input signal at its gate terminal) will have a gate oxide breakdown at its source terminal boundary. For example, when the transconductance circuit 112 is used in a comparator, especially a high-voltage comparator, the minimum and maximum levels difference of VIP and VIM may be well above the gate oxide reliability voltage rating of the transistors MP and MM. On the other hand, when the transconductance circuit 112 is used in an amplifier, if the amplifier input signal range is larger than the break down ratings of the transistors MP and MM, then it may have the same reliability problem as a high-voltage comparator. During stead-state, i.e., when the amplifier settles to its final output level or waveform, the two inputs VIP and VIM would substantially be equal and would not have a reliability problem, but the inputs VIP and VIM may be significantly different at the beginning of the settling and this would create reliability problem for the amplifier. Hence, a classical differential pair transconductance circuit 112 cannot operate reliably for high-voltage applications in the sense that the signal range is bound only when ΔVI is properly bound.

FIG. 2 is an electric circuit diagram of a transconductance circuit 212 with isolation diodes included in an amplification stage 210 of a device 200. Similar to FIG. 1, the amplification stage 210 may further include a load circuit 214, and the device 200 may be a comparator or an amplifier, where the amplification stage 210 may be a first preamplifier stage and may be followed up by one or more gain stages 220.

Similar to FIG. 1, the transconductance circuit 212 includes a differential pair of input transistors MP and MM, each of which may be a high-voltage transistor (e.g., an LDMOS transistor). Also similar to FIG. 1, in the transconductance circuit 212, one terminal of the first input transistor MP (e.g., the gate terminal of the transistor MP) may be coupled to a first input 232-1, where the transistor MP may receive a first input voltage VIP, while one terminal of the second input transistor MM (e.g., the gate terminal of the transistor MM) may be coupled to a second input 232-2, where the transistor MM may receive a second input voltage VIM. Further similar to FIG. 1, in the transconductance circuit 212, another terminal of the first input transistor MP (e.g., the drain terminal of the transistor MP) may be coupled to a first output 234-1, where the transistor MP may provide a first output current IOP, while another terminal of the second input transistor MM (e.g., the drain terminal of the transistor MM) may be coupled to a second output 234-2, where the transistor MM may provide a second output current IOM. Another similarity to FIG. 1 is that, as shown in FIG. 2, for each of transistors MP and MM of the transconductance circuit 212, the source terminal of the transistor may be coupled to the bulk terminal of the transistor.

In contrast to FIG. 1, the transconductance circuit 212 further includes an isolation diode DP and an isolation diode DM as shown in FIG. 2, and may, therefore, be referred to as an "isolating input transconductance circuit." As shown in FIG. 2, a third terminal of the first input transistor MP (e.g., the source terminal of the transistor MP) may be coupled to a first terminal of the isolation diode DP (e.g., to the anode terminal of the isolation diode DP), while a third terminal of the second input transistor MM (e.g., the source terminal of the transistor MM) may be coupled to a first terminal of the isolation diode DM (e.g., to the anode terminal of the isolation diode DM). The second terminal of the isolation diode DP (e.g., the cathode terminal of the isolation diode DP) may be coupled to the second terminal of the isolation diode DM (e.g., the cathode terminal of the isolation diode DM), e.g., by virtue of each of these second terminals being coupled to the node NCM. The node NCM and, therefore, the second terminals of each of the isolation diodes DP and DM may be coupled to a current source 244, configured to provide the tail current IT. The transconductance circuit 212 may further include a first bias current source 242-1, coupled to the source terminal of the first input transistor MP, and a second bias current source 242-2, coupled to the source terminal of the second input transistor MM. Each of the first and second bias current sources 242-1/2 may provide a bias current IB for the differential pair of the input transistors MP and MM of the transconductance circuit 212.

It is possible to view the input transistors MP and MM of the transconductance circuit 212 operating like a source follower whose bias current is changing between IB and IB+IT. The isolation diodes DP and DM may operate like a classical differential pair, or a half-diode bridge, to switch the tail current IT between the input transistors MP and MM with respect to the applied input signal difference ΔVI. Since the bias current of the input transistors MP and MM of the transconductance circuit 212 never reaches zero, they are always operating in the saturation region and, consequently, their gate oxide at the source terminal side is protected. For large ΔVI, the isolation diodes DP and DM effectively separate, or isolate, the positive and negative halves of the input stage to protect the input transistors MP and MM. In this manner, the architecture of the transconductance circuit 212 effectively migrates the high-voltage reliability problem from the input transistors MP, MM to the isolation diodes DP, DM. For reliable operation, the reverse breakdown voltage of the isolation diodes DP, DM should match the BVDS of the input transistors MP, MM.

The transconductance circuit 212 has several advantages. One is that the architecture of the transconductance circuit 212 is symmetrical and can accept differential, as well as single-ended, input signals. Another advantage is that the input transistors MP, MM are always on. Hence, the stage delay does not suffer from the on/off transitions of the input transistors. Yet another advantage is that the transconductance circuit 212 requires relatively small ΔVI to switch the tail current IT completely. Still another advantage is that the transconductance circuit 212 provides its largest transconductance at the input cross point (i.e., when ΔVI is substantially equal to zero) and the transconductance is reduced as ΔVI increases. Hence, the transconductance circuit 212 balances the large gain requirement for small input signal amplification to a given logic level versus minimization of the delay variation due to the inter-stage node voltage overdrive at a large ΔVI.

The transconductance circuit 212 also has some disadvantages in certain settings. One disadvantage is that the transconductance circuit 212 requires isolation diodes with a fast turn on and turn off, and with low parasitic capacitance (such as Schottky diodes) with a large reverse breakdown voltage. Another disadvantage is that the transconductance circuit 212 requires extra voltage headroom for the isolation diodes DP, DM, thereby reducing the usable input signal range. Yet another disadvantage of the transconductance circuit 212 is that the maximum transconductance that can be achieved for a given power level may be reduced due to the source degeneration effect of the isolation diodes DP, DM. Although the transconductance circuit 212 may be well suited for high-speed and low-voltage designs, the first disadvantage listed above (or, rather, the lack of such isolation diodes) may be one of the reasons why the transconductance circuit 212 may fail to deliver the required performance level for high-speed, high-voltage applications. While it is possible to relax the high breakdown voltage requirement by cascoding multiple isolation diodes, this imposes a heavy penalty on the headroom requirement (hence on the usable input signal range) and on delay variation. In contrast, the transconductance circuit with degeneration transistors, as described herein, implements the input isolation scheme (and, hence, protects the input transistors) without the need for extra voltage headroom or an isolation diode with properties required for the transconductance circuit 212.

Although not specifically shown in the present drawings, other examples of conventional transconductance circuits rely on clamping of the input signal before driving a classical differential pair. Such circuits, however, have disadvantages as well. For example, they are not symmetrical with respect to the input signals and, hence, are only suitable for applications with a single-ended input compared to a DC threshold voltage.

A Transconductance Circuit with Degeneration Transistors

Figure 3:
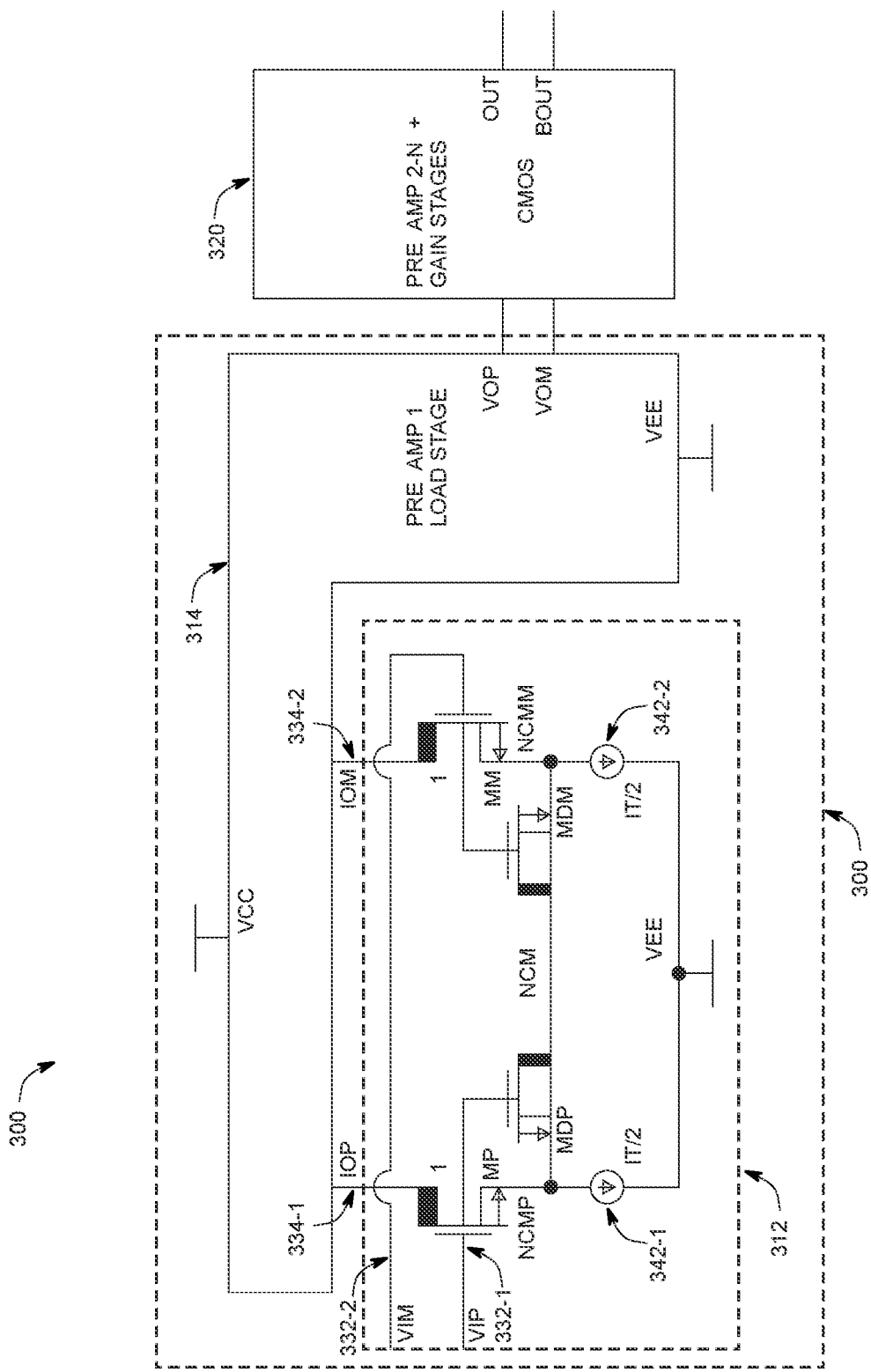
FIG. 3 is an electric circuit diagram of a transconductance circuit with degeneration transistors included in an amplification stage a device, according to some embodiments of the present disclosure.

FIG. 3 is an electric circuit diagram of a transconductance circuit 312 with degeneration transistors included in an amplification stage 310 a device 300, according to some embodiments of the present disclosure. Similar to FIG. 1, the amplification stage 310 may further include a load circuit 314, and the device 300 may be a comparator or an amplifier, where the amplification stage 310 may be a first preamplifier stage and may be followed up by one or more gain stages 320.

Similar to FIG. 1, the transconductance circuit 312 includes a differential pair of input transistors MP and MM, each of which may be a high-voltage transistor (e.g., an LDMOS transistor). Also similar to FIG. 1, in the transconductance circuit 312, one terminal of the first input transistor MP (e.g., the gate terminal of the transistor MP) may be coupled to a first input 332-1, where the transistor MP may receive a first input voltage VIP, while one terminal of the second input transistor MM (e.g., the gate terminal of the transistor MM) may be coupled to a second input 332-2, where the transistor MM may receive a second input voltage VIM. Further similar to FIG. 1, in the transconductance circuit 312, another terminal of the first input transistor MP (e.g., the drain terminal of the transistor MP) may be coupled to a first output 334-1, where the transistor MP may provide a first output current IOP, while another terminal of the second input transistor MM (e.g., the drain terminal of the transistor MM) may be coupled to a second output 334-2, where the transistor MM may provide a second output current IOM. Another similarity to FIG. 1 is that, as shown in FIG. 3, for each of transistors MP and MM of the transconductance circuit 312, the source terminal of the transistor may be coupled to the bulk terminal of the transistor. Also similar to FIG. 1, the transconductance circuit 312 may further include a first current source 342-1, coupled to the source terminal of the first input transistor MP, and also include a second current source 342-2, coupled to the source terminal of the second input transistor MM. Together, the first and second current sources 342-1/2 may provide a total tail current IT for the differential pair of the input transistors MP and MM of the transconductance circuit 312, e.g., each current source 342 may provide a tail current IT/2 in some embodiments, although in other embodiments this distribution may be different, as described in greater detail below.

In contrast to FIG. 1, the transconductance circuit 312 further includes a degeneration transistor MDP and a degeneration transistor MDM as shown in FIG. 3, and may, therefore, be referred to as a "transconductance circuit with degeneration transistors." As shown in FIG. 3, a third terminal of the first input transistor MP (e.g., the source terminal of the transistor MP) may be coupled to a third terminal of the degeneration transistor MDP (e.g., the source terminal of the degeneration transistor MDP, which source terminal may be coupled to the bulk terminal of the degeneration transistor MDP). As also shown in FIG. 3, a third terminal of the second input transistor MM (e.g., the source terminal of the transistor MM) may be coupled to a third terminal of the degeneration transistor MDM (e.g., the source terminal of the degeneration transistor MDM, which source terminal may be coupled to the bulk terminal of the degeneration transistor MDM). The second terminal of the degeneration transistor MDP (e.g., the drain terminal of the degeneration transistor MDP) may be coupled to the second terminal of the degeneration transistor MDM (e.g., the drain terminal of the degeneration transistor MDM), e.g., by virtue of the second terminal of each degeneration transistor being coupled to the node NCM, as shown in FIG. 3. The first terminal of the first degeneration transistor MDP (e.g., the gate terminal of the degeneration transistor MDP) may be coupled to the first input 332-1, where the degeneration transistor MDP may receive the first input voltage VIP, while the first terminal of the second degeneration transistor MDM (e.g., the gate terminal of the degeneration transistor MDM) may be coupled to the second input 332-2, where the degeneration transistor MDM may receive the second input voltage VIM.

Turning to the aspect ratios of various transistors included in the transconductance circuit 312, an aspect ratio ($A_x$) of a FET refers to a ratio of a channel width ($w_x$) to a channel length ($l_x$) of the FET:

$$A_x = \frac{w_x}{l_x} \tag{1}$$

In some embodiments of the transconductance circuit 312, a ratio of an aspect ratio of the degeneration transistor MDP ($A_{MDP}$) to an aspect ratio of the input transistor MP ($A_{MP}$) may be substantially equal to a ratio of an aspect ratio of the degeneration transistor MDM ($A_{MDM}$) to an aspect ratio of the input transistor MM ($A_{MM}$):

$$\frac{A_{MDP}}{A_{MP}} = \frac{A_{MDM}}{A_{MM}} \tag{2}$$

In some embodiments of the transconductance circuit 312, the aspect ratio of the first input transistor MP may be substantially equal to the aspect ratio of the second input transistor MM, or, equivalently, the aspect ratio of the first degeneration transistor MDP may be substantially equal to the aspect ratio of the second degeneration transistor MDM. For example, the aspect ratio of each of the first and second input transistors MP, MM may be about 1, while the aspect ratio of each of the first and second degeneration transistors MDP, MDM may be about N, where N is any positive real number. However, in other embodiments, these aspect ratios may be different, as long as the ratio of the aspect ratios of the first degeneration and input transistors MDP, MP is substantially equal to the ratio of the aspect ratios of the second degeneration and input transistors MDM, MM. In the embodiments when the aspect ratio of the first input transistor MP is not equal to the aspect ratio of the second input transistor MM, the respective tail current sources 342-1, 342-2 coupled to these transistors may be rationed as well. In general, if the aspect ratio of the first input transistor MP is designated as "$A_{MP}$" and the aspect ratio of the second input transistor MM is designated as "$A_{MM}$", the first tail current source 342-1 coupled to the first input transistor MP may be configured to provide a current $IT_1$ of $$IT_1 = \frac{A_{MP}}{A_{MP} + A_{MM}} * IT, \tag{3}$$

while the second tail current source 342-2 coupled to the second input transistor MM may be configured to provide a current $IT_2$ of $$IT_2 = \frac{A_{MM}}{A_{MP} + A_{MM}} * IT, \quad (4)$$

so that the sum of these two currents is substantially equal to IT. For example, if the aspect ratio of the first input transistor MP may be substantially equal to the aspect ratio of the second input transistor MM and the aspect ratio of the first degeneration transistor MDP may be substantially equal to the aspect ratio of the second degeneration transistor MDM, then each of the first tail current source 342-1 and the second tail current source 342-2 may provide the current IT/2.

The aspect ratios of the first and second input transistors MP, MM, and the first and second degeneration transistors MDP, MDM may affect the equivalent transconductance (GM) of the transconductance circuit 312. For example, if a ratio of the aspect ratio of the first degeneration transistor MDP to the aspect ratio of the first input transistor MP is N (or, equivalently, if a ratio of the aspect ratio of the second degeneration transistor MDM to the aspect ratio of the second input transistor MM is N), then the transconductance GM of the transconductance circuit 312 when the first input voltage VIP is equal to the second input voltage VIM may be proportional to N/(1+N). For example, in some embodiments, the transconductance GM may be calculated as $$GM = \frac{N}{N+1} * gm_{MP}, \quad (5)$$

where $gm_{MP}$ is the transconductance of the first input transistor MP, and where $gm_{MP}$ may be calculated as $$gm_{MP} = \sqrt{\Delta_{MP} * IT}, \quad (6)$$

where $\Delta_{MP}$ is the gain of the transistor MP and may be calculated as $$\beta_{MP} = \mu_n * C_{ox} * \frac{w_{MP}}{l_{MP}} = \mu_n * C_{ox} * A_{MP}. \quad (7)$$

In some embodiments, during operation of the transconductance circuit 312, each of the first input transistor MP and the second input transistor MM may be configured to operate in a saturation region. On the other hand, each of the first degeneration transistor MDP and the second degeneration transistor MDM may be configured to operate either in a linear region or in a saturation region. In particular, in some embodiments, when one of the degeneration transistors MDP, MDM enters the saturation region, another one may continue to operate in the linear region. The transistors MDP, MDM may function as nonlinear degeneration resistors and, hence, are referred to as "degeneration transistors." Because the degeneration transistors MDP, MDM never turn off during normal operation, they do not suffer from the MOS channel forming/removing time constants.

It can be shown that, during operation of the transconductance circuit 312, an equivalent degeneration resistance between the source terminal of the first degeneration transistor MDP (e.g., the node NCMP shown in FIG. 3) and the source terminal of the second degeneration transistor MDM (e.g., the node NCMM shown in FIG. 3) may be symmetric with respect to the input signal difference ΔVI, meaning that the resistance between the nodes NCMP to NCMM may change with the applied input signal difference VIP–VIM and that the actual value of this resistance may change the value of the transconductance GM, where the change is symmetric in that GM(VIP–VIM)=GM(VIM–VIP). Hence, the transconductance circuit 312 would produce the same output current IOP, IOM if a voltage difference of 100 mV or a voltage difference of –100 mV is applied at the inputs VIP, VIM. It can also be shown that the equivalent degeneration resistance between the nodes NCMP and NCMM may be smallest when the first input voltage VIP is substantially equal to the second input voltage VIM. Furthermore, the equivalent resistance between the source terminal of the first degeneration transistor MDP and the source terminal of the second degeneration transistor MDM may increase as an absolute value (or magnitude) of a difference between the input voltages VIP and VIM increases. Once the degeneration transistor whose gate terminal is coupled to the lowest input voltage (which could be either transistor MDP or transistor MDP) enters into the saturation region, the positive and negative half of the transconductance circuit 312 become effectively isolated from each other. Hence, the proposed input stage does not need any extra protection devices for high-voltage protection and is self-protected.

The degeneration transistors MDP and MDM reduce the equivalent transconductance GM of the differential pair of the input transistors MP, MM. It can be shown that the equivalent transconductance GM at ΔVI=0 may be reduced by N/(1+N). Hence, the equivalent transconductance GM may drop to 80% of its value compared to the zero-degeneration case at the same power level when N=4.

Once one of the degeneration transistors MDP, MDM enters the saturation region, the drain current of the respective input transistor reaches its minimum level and is substantially equal to IT/2*(N+1). The remaining of the respective input side tail current may then be conveyed to the complementary half input side through the degeneration transistor operating in the saturation region. Under this condition, the output currents ratio may be substantially equal to 2N+1. If desired, these values can be arbitrarily set by properly choosing the ratio of the input and degeneration transistor aspect ratios, i.e., by choosing N. This feature is particularly attractive because it prevents the input transistors MP, MM from entering the cut-off region that would slow the block down during normal operation. In addition, it allows trading-off between small-signal gain and minimum input signal difference for total tail current switching with large signal overdrives and NCMP/NCMM node capacitance related delay variation reduction. In some implementations, high small-signal gain and small input signal difference for total tail current switching goals may favor a relatively large N value, whereas reduced large signal overdrive and reduced NCMP/NCMM node capacitance related delay variation goals may favor a relatively small N value. The exact value of N specific for the transistors used in the transconductance circuit 312 may be determined using simulation. It can be shown that, in some implementations, once one of the degeneration transistors MDP, MDM enters into the saturation region, the complementary degeneration transistor stays in the linear operation region if N is chosen larger than or equal to about 1.5. The large voltage drop between NCMP and NCMM nodes may appear mainly across the drain source terminal of the degeneration transistor operating in the saturation region.

As the foregoing illustrates, the transconductance circuit 312 is symmetric with respect to the input terminals and, therefore, may advantageously process both single-ended as well as differential input signals. By including the degeneration transistors MDP, MDM as described above, the transconductance circuit 312 may operate up to the BVDS of the transistors included therein without any reliability problems in absence of additional protection mechanisms. The transconductance circuit 312 may have lower parasitic load capacitance, which may translate to lower power consumption at a given data rate, compared to conventional implementations.

Example Systems

Various embodiments of transconductance circuits with degeneration transistors as described above may be implemented in any kind of system where conversion of voltage to current may be used. One example of such a system was shown in FIG. 3, where the transconductance circuit 312 is shown as a part of the amplification stage 310 that further includes the load circuit 314 and is followed up by the one or more gain stages 320. However, in other embodiments, the transconductance circuit 312 may be a part of the amplification stage 310 that further includes the load circuit 314 but is not followed up by the one or more gain stages 320 illustrated in FIG. 3, while, in still other embodiments, the transconductance circuit 312 is not necessarily used with the load circuit 314 as shown in FIG. 3.

In some embodiments, the transconductance circuit 312 may be included in a comparator or an amplifier, e.g., as was described above with reference to the transconductance circuit 112.

In other embodiments, the transconductance circuit 312 may be included in various range finding systems. For example, aspects of this disclosure can be implemented in any suitable light detection and ranging (LIDAR) system such as, for example, automotive LIDAR, industrial LIDAR, space LIDAR, military LIDAR, etc. LIDAR systems can include a receiver or a transmitter and a receiver. LIDAR systems can be integrated with a vehicle, such as an automobile, a drone such as an unmanned flying machine, an autonomous robot, or a space vehicle. LIDAR systems can transmit and/o receive laser light. LIDAR systems can be used for three-dimensional sensing applications. LIDAR systems can be used with augmented reality technology.

In further embodiments, the transconductance circuit 312 may be included in a radio system, e.g., in an RF transmitter of a cellular wireless communication system. In still other embodiments, the transconductance circuit 312 may be used in variable gain-amplifiers, continuous-time filters, delta-sigma modulators, or data converters.

Moreover, various embodiments of transconductance circuits with degeneration transistors can be implemented in various electronic devices. Examples of the electronic devices can include, but are not limited to, electronic products, parts of electronic products such as integrated circuits, vehicular electronics such as automotive electronics, etc. Further, the electronic devices can include unfinished products.

Select Examples

The following paragraphs provide examples of various ones of the embodiments disclosed herein.

Example 1 provides a transconductance circuit that includes a first and a second portions. The first portion includes a first degeneration transistor (e.g., transistor MDP), configured to receive a first input voltage (e.g., voltage $V_{IP}$) at a first input, and a first input transistor (e.g., transistor MP), coupled to the first degeneration transistor, and configured to provide a first output current (e.g., current IOP) at a first output. The second portion includes a second degeneration transistor (e.g., transistor MDM), coupled to the first degeneration transistor and configured to receive a second input voltage (e.g., voltage $V_{IM}$) at a second input, and a second input transistor (e.g., transistor MM), coupled to the second degeneration transistor, and configured to provide a second output current (e.g., current IOM) at a second output. The first degeneration transistor is further coupled to the second degeneration transistor.

Example 2 provides the transconductance circuit according to example 1, where each of the first degeneration transistor, the second degeneration transistor, the first input transistor, and the second input transistor has a gate terminal, a source terminal, and a drain terminal.

Example 3 provides the transconductance circuit according to example 2, where the first degeneration transistor is configured to receive the first input voltage at the first input by having the gate terminal of the first degeneration transistor being coupled to the first input, and the second degeneration transistor is configured to receive the second input voltage at the second input by having the gate terminal of the second degeneration transistor being coupled to the second input.

Example 4 provides the transconductance circuit according to examples 2 or 3, where the first input transistor is coupled to the first degeneration transistor by having the source terminal of the first input transistor being coupled to the source terminal of the first degeneration transistor, and the second input transistor is coupled to the second degeneration transistor by having the source terminal of the second input transistor being coupled to the source terminal of the second degeneration transistor.

Example 5 provides the transconductance circuit according to any one of examples 2-4, where the first input transistor is configured to provide the first output current at the first output by having the drain terminal of the first input transistor being coupled to the first output, and the second input transistor is configured to provide the second output current at the second output by having the drain terminal of the second input transistor being coupled to the second output.

Example 6 provides the transconductance circuit according to any one of examples 2-5, where the first degeneration transistor is coupled to the second degeneration transistor by having the drain terminal of the first degeneration transistor being coupled to the drain terminal of the second degeneration transistor.

Example 7 provides the transconductance circuit according to any one of examples 2-6, where, for each transistor of the first degeneration transistor, the first input transistor, the second degeneration transistor, and the second input transistor, the source terminal of the each transistor is coupled to a bulk terminal of the each transistor.

Example 8 provides the transconductance circuit according to any one of examples 2-7, where a ratio of an aspect ratio of the first degeneration transistor to an aspect ratio of the first input transistor is substantially equal to a ratio of an aspect ratio of the second degeneration transistor to an aspect ratio of the second input transistor.

Example 9 provides the transconductance circuit according to any one of examples 2-8, where a ratio of an aspect ratio of the first degeneration transistor to an aspect ratio of the first input transistor is N, and a transconductance (GM) of the transconductance circuit when the first input voltage is equal to the second input voltage is proportional to $N/(1+N)$.

Example 10 provides the transconductance circuit according to any one of examples 2-9, further including a first current source, coupled to the source terminal of the first input transistor, and a second current source, coupled to the source terminal of the second input transistor, where, when an aspect ratio of the first input transistor is $A_{MP}$ and an aspect ratio of the second input transistor is $A_{MM}$, the first current source is configured to generate a current substantially equal to $A_{MP}/(A_{MP}+A_{MM})*IT$, and the second current source is configured to generate a current substantially equal to $A_{MM}/(A_{MP}+A_{MM})*IT$, where IT is a tail current of the differential pair of first and second input transistors.

Example 11 provides the transconductance circuit according to any one of examples 2-10, where, during operation of the transconductance circuit, an equivalent resistance between the source terminal of the first degeneration transistor (e.g., the node NCMP shown in FIG. 3) and the source terminal of the second degeneration transistor (e.g., the node NCMM shown in FIG. 3) is smallest when the first input voltage is substantially equal to the second input voltage.

Example 12 provides the transconductance circuit according to example 11, where, during operation of the transconductance circuit, equivalent resistance between the source terminal of the first degeneration transistor and the source terminal of the second degeneration transistor increases as an absolute value (or magnitude) of a difference between the first input voltage and the second input voltage increases.

Example 13 provides the transconductance circuit according to any one of the preceding examples, where, during operation of the transconductance circuit, each of the first input transistor and the second input transistor is configured to operate in a saturation region.

Example 14 provides the transconductance circuit according to any one of the preceding examples, where, during operation of the transconductance circuit, each of the first degeneration transistor and the second degeneration transistor is configured to operate either in a linear region or in a saturation region.

Example 15 provides the transconductance circuit according to example 14, where, during operation of the transconductance circuit, when one of the first degeneration transistor and the second degeneration transistor enters the saturation region, another one of the first degeneration transistor and the second degeneration transistor continues to operate in the linear region.

Example 16 provides the transconductance circuit according to any one of the preceding examples, where each of the first degeneration transistor, the second degeneration transistor, the first input transistor, and the second input transistor is one of an EDMOS transistor, a DMOS transistor, an LDMOS transistor, or a VMOS transistor.

Example 17 provides a transconductance circuit that includes a first transistor (e.g., transistor MDP), configured to receive a first input voltage (e.g., voltage $V_{IP}$) at a first input; a second transistor (e.g., transistor MP), coupled to the first transistor, and configured to provide a first output current (e.g., current 10P) at a first output; a third transistor (e.g., transistor MDM), coupled to the first transistor and configured to receive a second input voltage (e.g., voltage $V_{IM}$) at a second input; and a fourth transistor (e.g., transistor MM), coupled to the third transistor, and configured to provide a second output current (e.g., current IOM) at a second output, where the first transistor is further coupled to the third transistor.

Example 18 provides the transconductance circuit according to example 17, where each of the first transistor, the second transistor, the third transistor, and the fourth transistor has a gate terminal, a source terminal, and a drain terminal, the first transistor is configured to receive the first input voltage at the first input by having the gate terminal of the first transistor being coupled to the first input, and the third transistor is configured to receive the second input voltage at the second input by having the gate terminal of the third transistor being coupled to the second input.

In other examples, the transconductance circuit according to examples 17 or 18 may be the transconductance circuit according to examples 2-16, where the "first degeneration transistor" of examples 2-16 is the "first transistor" of the transconductance circuit according to examples 17 or 18, the "first input transistor" of examples 2-16 is the "second transistor" of the transconductance circuit according to examples 17 or 18, the "second degeneration transistor" of examples 2-16 is the "third transistor" of the transconductance circuit according to examples 17 or 18, and the "second input transistor" of examples 2-16 is the "fourth transistor" of the transconductance circuit according to examples 17 or 18.

Example 19 provides the transconductance circuit according to examples 17 or 18, where a ratio of an aspect ratio of the first degeneration transistor to an aspect ratio of the first input transistor is substantially equal to a ratio of an aspect ratio of the second degeneration transistor to an aspect ratio of the second input transistor.

Example 20 provides a transconductance circuit that includes a plurality of transistors, including a first transistor, a second transistor, a third transistor, and a fourth transistor, each of which having a gate terminal, a source terminal, and a drain terminal. The transconductance circuit further includes a first input, coupled to the gate terminal of the first transistor and to the gate terminal of the third transistor; a second input, coupled to the gate terminal of the second transistor and to the gate terminal of the fourth transistor; a first output, coupled to the drain terminal of the second transistor; and a second output, coupled to the drain terminal of the fourth transistor. In such a transconductance circuit, the drain terminal of the first transistor is coupled to the drain terminal of the third transistor, the source terminal of the first transistor is coupled to the source terminal of the second transistor, and the source terminal of the third transistor is coupled to the source terminal of the fourth transistor.

In other examples, the transconductance circuit according to example 20 may be the transconductance circuit according to examples 1-16, where the "first degeneration transistor" of examples 1-16 is the "first transistor" of the transconductance circuit according to example 20, the "first input transistor" of examples 1-16 is the "second transistor" of the transconductance circuit according to example 20, the "second degeneration transistor" of examples 1-16 is the "third transistor" of the transconductance circuit according to example 20, and the "second input transistor" of examples 1-16 is the "fourth transistor" of the transconductance circuit according to example 20.

Example 21 provides an electronic component, including one or more transconductance circuits according to any one of the preceding examples.

Example 22 provides the electronic component according to example 21, where the electronic component is an amplifier or a comparator.

Example 23 provides a method, including steps performed by a transconductance circuit or an electronic component according to any one of the preceding examples.

Example 24 provides a method, including steps that cause a transconductance circuit or an electronic component to operate according to any one of the preceding examples.

Other Implementation Notes, Variations, and Applications

The illustration of FIG. 3 provides just one non-limiting example where transconductance circuits with degeneration transistors as described herein may be used. Various teachings related to transconductance circuits with degeneration transistors as described herein are applicable to a large variety of other systems. In some scenarios, various embodiments of transconductance circuits with degeneration transistors as described herein can be used in automotive systems, safety-critical industrial applications, medical systems, scientific instrumentation, wireless and wired communications, radar, industrial process control, audio and video equipment, current sensing, instrumentation (which can be highly precise), and various digital-processing-based systems. In other scenarios, various embodiments of transconductance circuits with degeneration transistors as described herein can be used in the industrial markets that include process control systems that help drive productivity, energy efficiency, and reliability. In yet further scenarios, various embodiments of transconductance circuits with degeneration transistors may be used in consumer applications.

While certain embodiments have been described, these embodiments have been presented by way of example, and are not intended to limit the scope of the disclosure. Indeed, the novel methods, apparatus, and systems described herein may be embodied in a variety of other forms. Furthermore, various omissions, substitutions and changes in the form of the methods, apparatus, and systems described herein may be made without departing from the spirit of the disclosure. For example, circuit blocks and/or circuit elements described herein may be deleted, moved, added, subdivided, combined, and/or modified. Each of these circuit blocks and/or circuit elements may be implemented in a variety of different ways. The accompanying claims and their equivalents are intended to cover any such forms or modifications as would fall within the scope and spirit of the disclosure.

Any of the principles and advantages discussed herein can be applied to other systems, devices, integrated circuits, electronic apparatus, methods, not just to the embodiments described above. The elements and operations of the various embodiments described above can be combined to provide further embodiments. The principles and advantages of the embodiments can be used in connection with any other systems, devices, integrated circuits, apparatus, or methods that could benefit from any of the teachings herein.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

In one example embodiment, any number of transconductance circuits with degeneration transistors as described above may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, controllers for configuring any of the components, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the transconductance circuits with degeneration transistors as described above may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the transconductance circuits with degeneration transistors as described above may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of degeneration or input transistors, etc.) have only been offered for purposes of example and teaching only. Such information may be varied considerably without departing from the spirit of the present disclosure, or the scope of the appended claims. The present descriptions may apply only to some non-limiting examples and, accordingly, they should be construed as such. In the foregoing description, example embodiments have been described with reference to particular arrangements of components. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the present drawings may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the present drawings and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended select examples. Note that all optional features of the apparatus described above may also be implemented with respect to the method or process described herein and specifics in the examples may be used anywhere in one or more embodiments.

The invention claimed is:

1. An integrated circuit, comprising:
    a first transistor to receive a first input voltage at a first input;
    a second transistor to receive a second input voltage at a second input, the second transistor coupled to the first transistor;
    a third transistor to provide a first output current at a first output, the third transistor coupled to the first transistor; and
    a fourth transistor to provide a second output current at a second output, the fourth transistor coupled to the second transistor,
    wherein, when a ratio of an aspect ratio of the first transistor to an aspect ratio of the third transistor is N, where N is a positive real number, a transconductance of the integrated circuit when the first input voltage is substantially equal to the second input voltage is proportional to N/(1+N).

2. The integrated circuit according to claim 1, wherein:
    the first transistor is to receive the first input voltage at the first input by having a gate terminal of the first transistor being coupled to the first input, and
    the second transistor is to receive the second input voltage at the second input by having a gate terminal of the second transistor being coupled to the second input.

3. The integrated circuit according to claim 1, wherein:
    the third transistor is coupled to the first transistor by having a source terminal of the third transistor being coupled to a source terminal of the first transistor, and
    the fourth transistor is coupled to the second transistor by having a source terminal of the fourth transistor being coupled to a source terminal of the second transistor.

4. The integrated circuit according to claim 1, wherein:
    the third transistor is to provide the first output current at the first output by having a drain terminal of the third transistor being coupled to the first output, and
    the fourth transistor is to provide the second output current at the second output by having a drain terminal of the fourth transistor being coupled to the second output.

5. The integrated circuit according to claim 1, wherein the first transistor is coupled to the second transistor by having a drain terminal of the first transistor being coupled to a drain terminal of the second transistor.

6. The integrated circuit according to claim 1, wherein, for each transistor of the first transistor, the third transistor, the second transistor, and the fourth transistor, a source terminal of the each transistor is coupled to a bulk terminal of the each transistor.

7. The integrated circuit according to claim 1, wherein a ratio of an aspect ratio of the first transistor to an aspect ratio of the third transistor is substantially equal to a ratio of an aspect ratio of the second transistor to an aspect ratio of the fourth transistor.

8. The integrated circuit according to claim 1, further comprising:
    a first current source, coupled to a source terminal of the third transistor, and
    a second current source, coupled to a source terminal of the fourth transistor,
    wherein, when an aspect ratio of the third transistor is $A_{MP}$ and an aspect ratio of the fourth transistor is $A_{MM}$, the first current source is to generate a current proportional to $A_{MP}/(A_{MP}+A_{MM})*IT$, and the second current source is to generate a current proportional to $A_{MM}/(A_{MP}+A_{MM})*IT$, where IT is a tail current.

9. The integrated circuit according to claim 1, wherein, during operation of the integrated circuit, an equivalent resistance between a source terminal of the first transistor and a source terminal of the second transistor is smallest when the first input voltage is substantially equal to the second input voltage.

10. The integrated circuit according to claim 1, wherein, during operation of the integrated circuit, equivalent resistance between a source terminal of the first transistor and a source terminal of the second transistor increases as an absolute value of a difference between the first input voltage and the second input voltage increases.

11. The integrated circuit according to claim 1, wherein, during operation of the integrated circuit, each of the third transistor and the fourth transistor is to operate in a saturation region.

12. The integrated circuit according to claim 1, wherein, during operation of the integrated circuit, each of the first transistor and the second transistor is to operate either in a linear region or in a saturation region.

13. The integrated circuit according to claim 1, wherein, during operation of the integrated circuit, when one of the first transistor and the second transistor enters the saturation region, another one of the first transistor and the second transistor continues to operate in the linear region.

14. The integrated circuit according to claim 1, wherein each of the first transistor, the second transistor, the third transistor, and the fourth transistor is one of an extended drain metal-oxide-semiconductor (EDMOS) transistor, a double-diffused metal-oxide-semiconductor (DMOS) transistor, a laterally-diffused metal-oxide-semiconductor (LDMOS) transistor, or a V-groove metal-oxide-semiconductor (VMOS) transistor.

15. The integrated circuit according to claim 1, wherein the integrated circuit is an amplifier circuit or a comparator circuit.

16. An integrated circuit, comprising:
    a first transistor to receive a first input voltage at a first input;

a second transistor to receive a second input voltage at a second input, the second transistor coupled to the first transistor;

a third transistor to provide a first output current at a first output, the third transistor coupled to the first transistor;

a fourth transistor to provide a second output current at a second output, the fourth transistor coupled to the second transistor;

a first current source coupled to the third transistor; and a second current source coupled to the fourth transistor, wherein, when an aspect ratio of the third transistor is AMP and an aspect ratio of the fourth transistor is $A_{MM}$, the first current source is to generate a current proportional to $A_{MP}/(A_{MP}+A_{MM})*IT$, and the second current source is to generate a current proportional to $A_{MM}/(A_{MP}+A_{MM})*IT$, where IT is a tail current.

17. The integrated circuit according to claim 16, wherein at least one of:

the first current source is coupled to a source terminal of the third transistor, and the second current source is coupled to a source terminal of the fourth transistor.

18. The integrated circuit according to claim 16, wherein:

the first current source is coupled to a source terminal of the third transistor, and the second current source is coupled to a source terminal of the fourth transistor.

19. The integrated circuit according to claim 16, wherein each of the first transistor, the second transistor, the third transistor, and the fourth transistor is one of an extended drain metal-oxide-semiconductor (EDMOS) transistor, a double-diffused metal-oxide-semiconductor (DMOS) transistor, a laterally-diffused metal-oxide-semiconductor (LDMOS) transistor, or a V-groove metal-oxide-semiconductor (VMOS) transistor.

20. The integrated circuit according to claim 16, wherein the integrated circuit is an amplifier circuit or a comparator circuit.

* * * * *